United States Patent
Dror et al.

(10) Patent No.: US 6,903,668 B1
(45) Date of Patent: Jun. 7, 2005

(54) DECOMPRESSION ACCELERATOR FOR FLASH MEMORY

(75) Inventors: Itai Dror, Omer (IL); Robert Silvern, Dix Hills, NY (US)

(73) Assignee: M-Systems Flash Disk Pioneers Ltd., Kfar Saba (IL)

( * ) Notice: Subject to any disclaimer, the term of this patent is extended or adjusted under 35 U.S.C. 154(b) by 0 days.

(21) Appl. No.: 10/714,955

(22) Filed: Nov. 18, 2003

(51) Int. Cl.[7] .............................................. H03M 7/40
(52) U.S. Cl. ................................ 341/67; 51/65; 51/87; 711/170
(58) Field of Search ........................... 341/51, 65, 67, 341/87; 711/170

(56) References Cited

U.S. PATENT DOCUMENTS

| | | |
|---|---|---|
| 5,208,593 A | 5/1993 | Tong et al. |
| 5,463,390 A | 10/1995 | Whiting et al. |
| 5,532,694 A | 7/1996 | Mayers et al. |
| 5,572,209 A | 11/1996 | Farmer et al. |
| 5,617,089 A | 4/1997 | Kinouchi et al. |
| 5,627,534 A | 5/1997 | Craft |
| 5,805,086 A | 9/1998 | Brown et al. |
| 5,818,364 A | 10/1998 | Hintzman et al. |
| 6,002,411 A * | 12/1999 | Dye ............................ 345/542 |
| 6,145,069 A * | 11/2000 | Dye ............................ 711/170 |
| 6,310,563 B1 * | 10/2001 | Har et al. ...................... 341/50 |
| 6,580,377 B1 | 6/2003 | Du et al. |

OTHER PUBLICATIONS

DEFLATE Compressed Data Format specification version 1.3 RFC 1951—May 1996.

* cited by examiner

*Primary Examiner*—Michael Tokar
*Assistant Examiner*—Nguyen Khai
(74) *Attorney, Agent, or Firm*—Mark M. Friedman

(57) ABSTRACT

A hardware accelerator for improving the decompression performance when decompressing data in Lempel-Ziv-Huffman compressed data format. The use of a Huffman encoding second stage in the popular and widely-used Lempel-Ziv-Huffman standard improves the compression ratio but complicates the decompression, because the Huffman encoding is applied selectively only to certain pails of the Lempel-Ziv tokens, and thus Huffman decoding must also be applied selectively during decompression. The present invention features a variable-length token decoder which is able to selectively decode the Huffman-encoded portions of the compressed data, and therefore enables high-performance decompression for compressed data having a very good compression ratio. Such an accelerator is well-suited for use in data processors which are to be loaded with pre-compressed data and software applications, particularly those employing flash memory.

12 Claims, 7 Drawing Sheets

DECOMPRESSION ACCELERATOR FOR FLASH MEMORY

FIELD OF THE INVENTION

The present invention relates to lossless data compression and decompression, and, more particularly, to optimizing data decompression performance for data which is stored in a flash memory device.

BACKGROUND OF THE INVENTION

It is often desirable to compress data in order to reduce the consumption of storage resources and/or transmission overhead. Through the use of lossless compression techniques, it is possible to compress and decompress the data exactly, without any loss of information during the compression/decompression process.

Generally, there is a tradeoff between the compression ratio and the processing performance achieved when performing the compression and decompression. The term "compression ratio" commonly denotes a measure of the effectiveness of the compression, and is widely defined as the percentage of the original data volume that has been eliminated by the compression. The more effective compression is, the higher the compression ratio. The term "performance" herein denotes a measure of the ability of a system or device to complete the execution of compression/decompression algorithms within a given amount of time and utilizing a given amount of general computational resources. The faster a system or device can complete the execution of compression/decompression algorithms, and the less interference such execution has with other computational tasks, the higher is the performance. It is well-known that, to increase the compression ratio (if it is possible to do so), it is necessary to perform additional processing on the data, both during the compression phase and the decompression phase.

Presently, one of the most popular lossless data compression/decompression algorithms in use is the well-known Lempel-Ziv 1977 algorithm (herein denoted as "Lempel-Ziv"), which compresses data by replacing repeated data patterns with compact bounded vector references to earlier occurrences. In the present application, the Lempel-Ziv data compression algorithm and the related Lempel-Ziv-Huffman algorithm are used as examples of data compression algorithms for describing embodiments of the present invention, and to illustrate how the present invention overcomes limitations of the prior art. It is understood, however, that the present invention is not limited to the use of Lempel-Ziv algorithms, and that other data compression algorithms may also be employed in various embodiments of the present invention.

Lempel-Ziv compression requires only a single pass through the data for both compression and decompression, and therefore it is easy to attain good performance with Lempel-Ziv. Lempel-Ziv alone, however, does not achieve optimum compression ratios. Further compression is possible by following a primary Lempel-Ziv compression stage with a secondary compression stage that selectively utilizes the Huffman encoding algorithm, as detailed in the *DEFLATE Compressed Data Format Specification Version 1.3, RFC* 1951—May 1996 (herein denoted as "RFC 1951"), which is incorporated by reference for all purposes as if set forth fully herein. This compound algorithm, as well as the data compression results obtained thereby are herein denoted as "Lempel-Ziv-Huffman". The secondary compression stage is herein characterized as "selectively" utilizing Huffman encoding because not all the compressed output data from the primary Lempel-Ziv compression stage is Huffman-encoded: certain portions of the tokens output from Lempel-Ziv are not processed by explicit Huffman encoding in the secondary stage. The term "token" herein denotes a data element which is utilized for the reconstruction of the original data prior to compression; Lempel-Ziv tokens carry information about the original data, and the compressed output from the Lempel-Ziv lossless data compression process can be viewed as a token series which uniquely specifies the original data but which is more compact than the original data. Lempel-Ziv tokens are of variable length and, as used herein, the term "token" referring to Lempel-Ziv compressed data denotes a data element specifying one of the following, in accordance with RFC 1951:

(a) a literal byte data value;
(b) the length, in bytes, of a repeated data pattern; or
(c) the backward distance, in bytes, of a repeated data pattern, measured with respect to the token's position.

It is important to note that, when decompressing compressed data, the decompression stages are applied in reverse order from the compression process. For Lempel-Ziv-Huffman, the decompression operates first on the compressed data by selectively utilizing explicit Huffman decoding, after which a Lempel-Ziv decompression stage operates.

It is also important to note that, because of the selective nature of the secondary compression stage, the overall Lempel-Ziv-Huffman compression process is not equivalent to a Lempel-Ziv compression followed by a standard Huffman encoding. Consequently, the decompression process is not equivalent to a standard Huffman decoding followed by a Lempel-Ziv decompression. The selective use of Huffman encoding with Lempel-Ziv improves the compression ratio but complicates the decompression process and lowers the currently-attainable decompression performance.

The well-known Huffman encoding algorithm achieves compression by assigning short codes to statistically-common symbols, while assigning longer codes to statistically-uncommon symbols. The term "symbol" herein denotes a primitive data element, usually represented by a specified series of bit values. As non-limiting examples, bytes and alphanumeric ASCII characters can be considered to be symbols. The compression of Huffman results directly from the use of variable-length encoding.

"Static Huffman" encoding (which is also referred to in the art as "Fixed Huffman" encoding) utilizes a predetermined fixed encoding scheme and requires a single pass through the data, in which the encoding is done according to the predetermined fixed encoding scheme. "Dynamic Huffman" utilizes an encoding scheme that depends on the statistics of the data being encoded and requires a double pass through the data. The first pass of Dynamic Huffman encoding collects statistical information, from which the encoding tables are venerated, and the second pass performs the encoding according to those encoding tables. Static Huffman encoding is usually employed only for short blocks of data, where it would be counterproductive to use Dynamic Huffman encoding, which requires writing information necessary to reconstruct the encoding tables into the compressed data blocks. For large blocks of data, Dynamic Huffman encoding generally achieves a better compression ratio and is preferred over Static Huffman encoding.

For many applications of lossless compression, a tradeoff involving reduced performance to attain higher compression ratios, is acceptable. For example, a common use of lossless data compression is in data communications, such as for transmitting data over a network. The higher the compression ratio, the lower will be the communication overhead, which usually justifies additional compression/decompression processing because communication costs are always much higher than local processing costs. Lempel-Ziv-Huffman is utilized extensively for lossless data compression in such applications. Well-known data compression/decompression software such as WinZip and PKZip and the Zlib compression/decompression library are widely used to implement Lempel-Ziv-Huffman lossless compression with generally-acceptable performance to achieve good compression ratios for a broad spectrum of data classifications. It is emphasized that in these implementations, Dynamic Huffman encoding (as described above) is normally utilized, because Static Huffman encoding does not attain as good a compression ratio.

Not all applications, however, can justify increased processing overhead when decompressing compressed data. In a non-limiting example, FIG. 1A illustrates functional blocks of a data processing device 100 that utilizes a memory (or storage device) 104 for primary mass storage. Memory 104 can, for example, be a flash memory. Devices of this sort include, but are not limited to, cellular telephones and embedded systems. Device 100 includes a memory controller 102, a CPU 108, and a CPU RAM 110. In the case where memory 104 is too slow to support efficient program execution by CPU 108 (such as in the case of flash memory), software stored in memory 104 must be first loaded from memory 104 into CPU RAM 110 before execution. As illustrated for this example in FIG. 1A, data 106 stored in memory 104 has been previously compressed, to improve efficacy of storage. Thus, compressed data 106 must be decompressed before storage in CPU RAM 110 as decompressed data 112, for direct access and use by CPU 108. Lempel-Ziv-Huffman compression using Dynamic Huffman encoding achieves good compression ratios with reasonable performance, and would be highly desirable for use in such an application. Unfortunately, however, the complexity of Lempel-Ziv-Huffman decompression with Dynamic Huffman decoding currently requires a software implementation for practical applications, and software cannot decompress the data at sufficient speed for fast loading of compressed data from flash memory into CPU RAM. Thus, although a good compression ratio can be attained by using Lempel-Ziv-Huffman compression using Dynamic Huffman encoding, the decompression performance is too low, thereby rendering Lempel-Ziv-Huffman compression using Dynamic Huffman encoding currently unsatisfactory for this and certain other important applications.

A prior art implementation of a system utilizing Lempel-Ziv-Huffman compression and decompression is disclosed in U.S. Pat. No. 5,532,694 to Mayers et al. (herein referred to as "Mayers"). Implementations of Mayers are, in practice, limited to using Static Huffman encoding, although Mayers states that the technique could be further adapted to utilize a Dynamic Huffman scheme.

It is noted that Mayers and other prior art implementations are concerned not only with decompression, but also with compressing the data. This imposes unnecessary limitations on prior art solutions, because in certain applications of data decompression, it may not be necessary for the compression to be performed by the same system or device that does the decompression. As a non-limiting example of this, system 100 (FIG. 1A) has the task of repeatedly decompressing compressed data 106 for execution by CPU 108 In many flash memory applications, compressed data 106 is an executable program or fixed operational data which can be loaded into flash memory 104 already in compressed format. In such cases, system 100 does not need to perform any data compression, but is responsible only for data decompression. It is possible, therefore, to configure such a system to optimize the data decompression performance separately from optimizing the data compression ratio. It is further noted that not only flash memory systems can benefit from such an optimization, but other types of memory and data storage can also benefit therefrom. Hence, the terms "memory", "memory device", and "data storage" herein denote any means for storing and retrieving machine-readable data, including, but not limited to: flash memory; RAM; ROM; PROM; register memory and data storage media such as magnetic and optical storage. Neither Mayers nor other prior art provides a means of separately optimizing lossless data compression and lossless data decompression in applications where compressed data stored in data storage or memory, such as flash memory, must be efficiently decompressed for loading into executable memory.

There is thus a need for, and it would be highly advantageous to have, a system and method for improving and optimizing lossless decompression performance for data stored in flash memory or other memory separate from optimizing lossless data compression ratio. In particular, there is a need for a system and method for improving and optimizing decompression performance for data which has been compressed by Lempel-Ziv-Huffman, using Dynamic Huffman encoding and decoding, which is suitable for practical applications such as in flash memory or other memory. The present invention achieves these goals.

SUMMARY OF THE INVENTION

The present invention is of a hardware decompression accelerator and an associated method for separately optimizing lossless data decompression performance and lossless data compression ratio for data stored in memory, such as flash memory.

The present invention also provides a hardware decompression accelerator for efficiently decompressing data that has been compressed using Lempel-Ziv-Huffman lossless compression utilizing Dynamic Huffman encoding, and a method for using such a hardware decompression accelerator to attain a reasonably-high data compression ratio and very high decompression performance for an important class of applications.

A decompression accelerator according to the present invention can be put to good advantage in any data processor which utilizes Lempel-Ziv-Huffman compressed data, particularly systems employing flash memory, as shown in FIG. 1A, and particularly in the case where Dynamic Huffman encoding and decoding are used. In addition, the present invention is especially valuable within a memory controller, such as a flash memory controller. The term "data processor" as used herein denotes any automated means, device, or system which processes, stores, retrieves, or utilizes data, including, but not limited to: computers; computer systems; data input/output and peripheral devices and controllers therefor; memory devices and controllers therefor; data storage and transmission devices and systems; communication devices and systems; telecommunications systems and devices; telephonic systems and devices; data-based game-playing devices, systems, and peripherals; data-based audio and video devices, systems, and peripherals; data and communication networks; and personal data appliances.

Therefore, according to the present invention there is provided a memory controller for a memory device, the memory controller including a lossless decompression accelerator operative to decompressing data that has been externally compressed and loaded into the memory device. In addition, according to the present invention there is provided a memory device including a lossless decompression accelerator operative to decompressing data that has been externally compressed and loaded into the memory device.

Preferably, the memory controller is for a flash memory device, and the memory device is a flash memory device. The scope of the present invention also includes a memory device that includes the memory controller of the present invention.

Moreover, according to the present invention there is provided a decompression accelerator for decompressing Lempel-Ziv-Huffman compressed data from an input stream and sending decompressed data corresponding thereto to an output stream, the decompression accelerator including: (a) a variable-length token decoder for selectively decoding Huffman-encoded code portions of Lempel-Ziv tokens and for selectively retrieving and passing extra bit portions of the Lempel-Ziv tokens without Huffman decoding; and (b) a Lempel-Ziv decoder for decompressing Lempel-Ziv tokens obtained from the variable-length token decoder.

Preferably, the variable-length token decoder includes a bit buffer, a token analyzer and a Huffman decoder. The bit buffer breaks fixed-length words from the input bit stream into variable-length words for Huffman decoding, and also retrieves extra bits. The output of the bit buffer is of variable length. The token analyzer determines characteristics of Lempel-Ziv tokens, coordinates the selective Huffman decoding of the code portions of the Lempel-Ziv tokens, and, for Lempel-Ziv tokens that include extra bit portions, coordinates the selective passing of the extra bit portions without Huffman decoding. The Huffman decoder effects the selective Huffman decoding, most preferably by dynamic Huffman decoding.

Preferably, the decompression accelerator also includes one or more of the following components:

An input buffer for buffering input data words between the input stream and the bit buffer.

A bit buffer controller for controlling the operation of the bit buffer.

An output selector for selecting output of the Huffman decoder and for selectively passing the variable-length output of the bit buffer.

A token constructor that reproduces Lempel-Ziv tokens that include extra bit portions, by assembling the code portions of the Lempel-Ziv tokens as decoded by the Huffman decoder and the corresponding extra bit portions.

A token buffer for buffering the Lempel-Ziv tokens from the variable-length token decoder and from the Lempel-Ziv decoder.

An output buffer for buffering decompressed output from the Lempel-Ziv decoder to the output stream.

The scope of the present invention also includes a data processor, a memory controller and a memory device that include the decompression accelerator of the present invention, and also a memory device that includes the memory controller. Preferably, the data processor includes flash memory. Preferably, the memory controller is a flash memory controller.

Furthermore, according to the present invention there is provided a method for efficiently storing and retrieving data for use, including: (a) providing a data processor having data storage and having a decompression accelerator; (b) compressing the data according to a lossless data compression format, thereby providing compressed data; (c) writing the compressed data to the processor data storage; and (d) decompressing the compressed data stored in the processor data storage using the processor decompression accelerator.

Preferably, the lossless data compression is Lempel-Ziv format, Lempel-Ziv-Static Huffman format or Lempel-Ziv-Dynamic Huffman format.

Preferably, the compressing is effected using lossless data compression software. Most preferably, the lossless data compression software is Lempel-Ziv compression software, Lempel-Ziv-Static Huffman compression software or Lempel-Ziv-Dynamic Huffman compression software.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of a method and system for optimizing lossless data compression ratio and decompression performance according to the present invention may be understood with reference to the drawings and the accompanying description.

As noted previously, the Lempel-Ziv and related Lempel-Ziv-Huffman lossless data compression algorithms are employed as non-limiting examples in embodiments of the present invention, it being understood that embodiments of the present invention are not limited to any particular lossless compression algorithm, but may be applied to any suitable system of lossless compression and decompression.

Figure 1A:
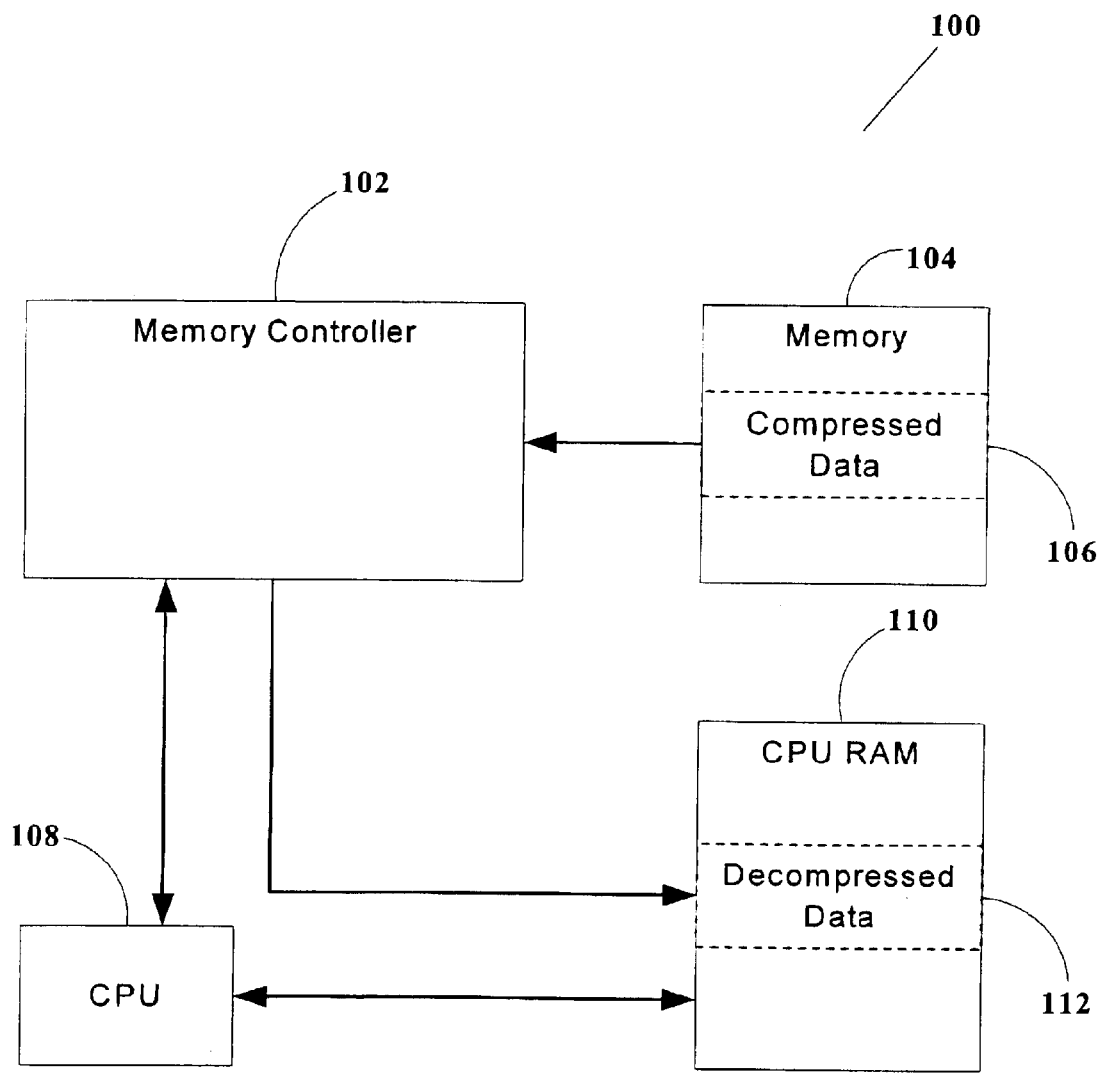
FIG. 1A is a block diagram of a general device environment where compressed data is stored in flash memory, for decompression and storage in CPU RAM for fast access by the CPU.
Figure 1B:
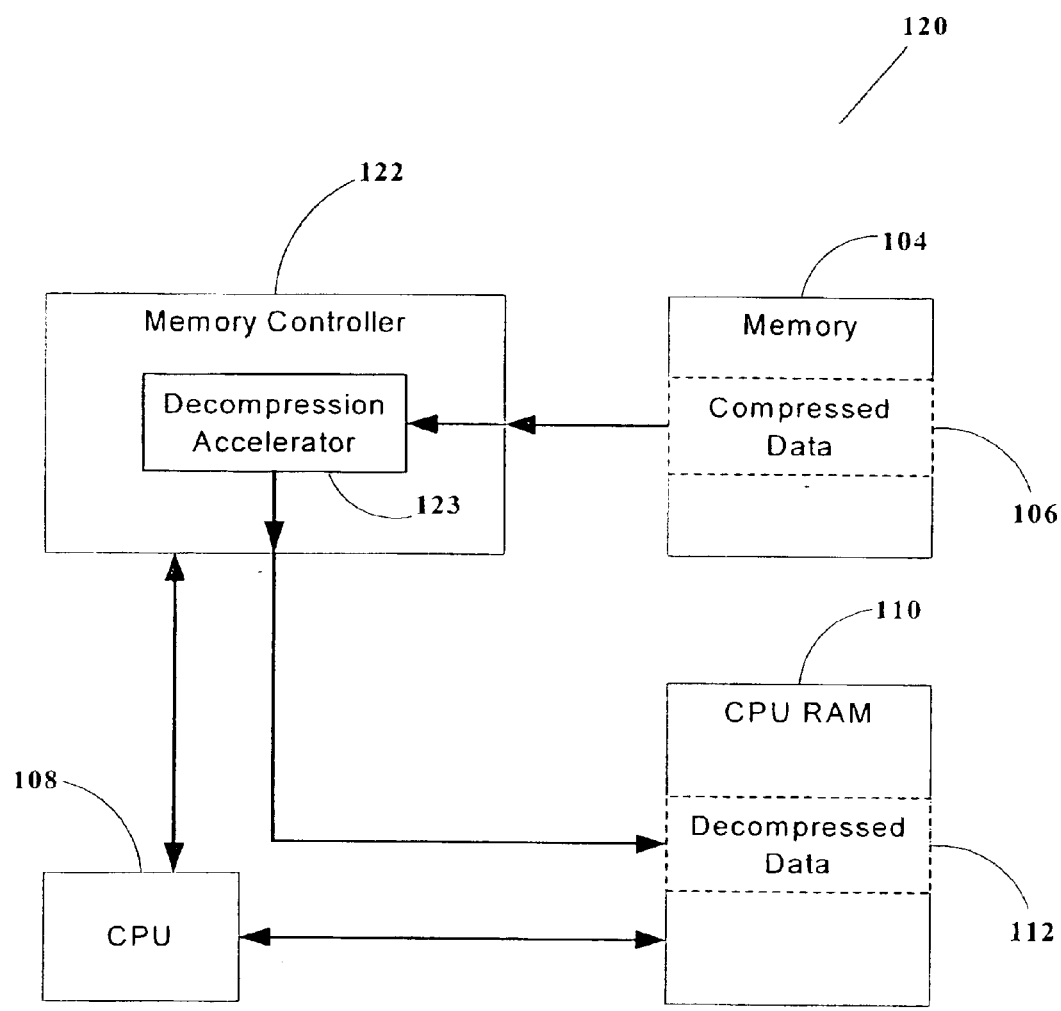
FIG. 1B is a block diagram of an embodiment of the present invention featuring a hardware decompression accelerator incorporated into a memory controller.

FIG. 1B is a block diagram of an embodiment of the present invention and featuring a system 120 containing a memory controller 122 which includes a hardware decompression accelerator 123. The function of system 120 is similar to that of system 100 (FIG. 1A), except that decompression accelerator 123 optimizes the decompression performance by handling decompression operations that would otherwise have to be performed by CPU 108. It is understood that compressed data 106 has been externally compressed, after which compressed data 106 was loaded into memory 104. The term "externally compressed" herein denotes data that has been compressed by a lossless compression performed by a system or device external to the system or device which performs the decompression. The compressing of the data by a system or device external to the decompressing system or device allows the compression to be optimized separately from the decompression.

Figure 1C:
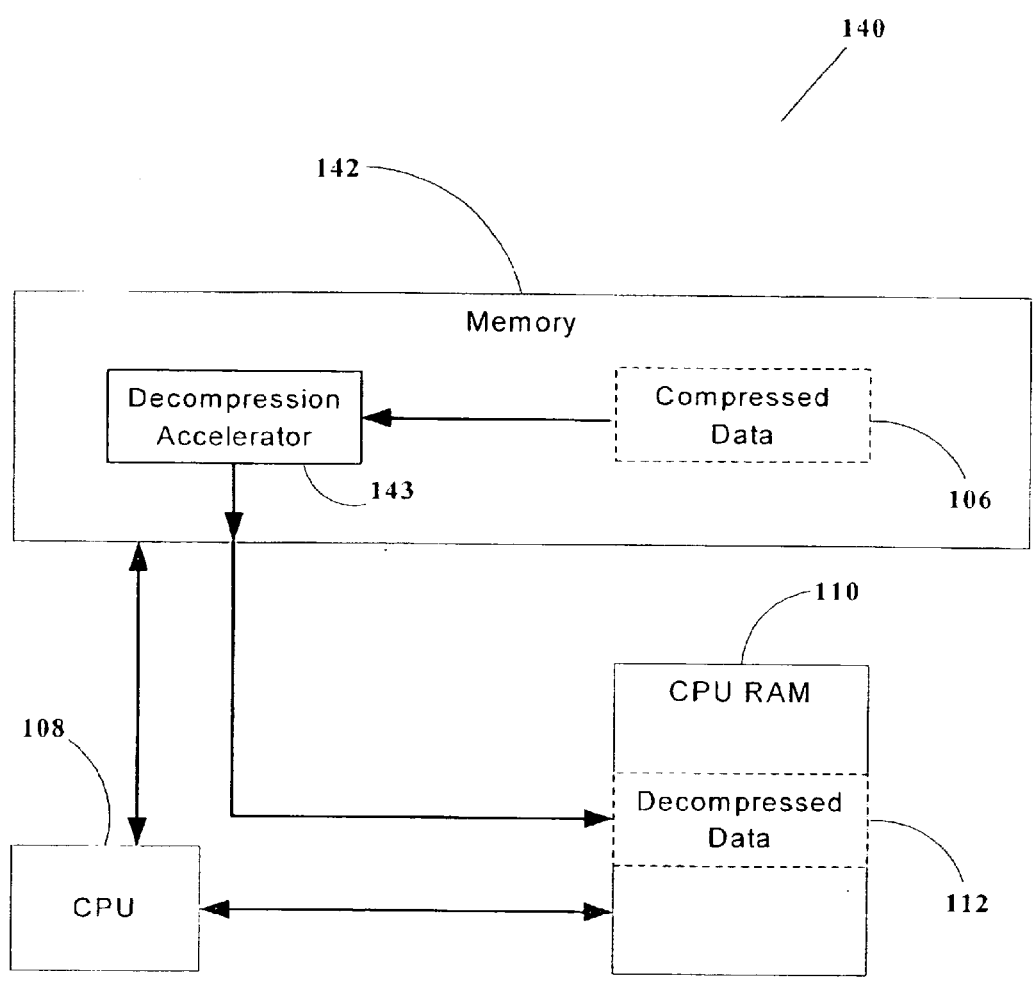
FIG. 1C is a block diagram of an embodiment of the present invention featuring a hardware decompression accelerator incorporated into a memory device.

FIG. 1C is a block diagram of another embodiment of the present invention and featuring a system 140 with a memory device 142 containing a decompression accelerator 143. The function of system 140 is similar to that of system 120 (FIG. 1B) except that there is no memory controller external to memory device 142.

Figure 2:
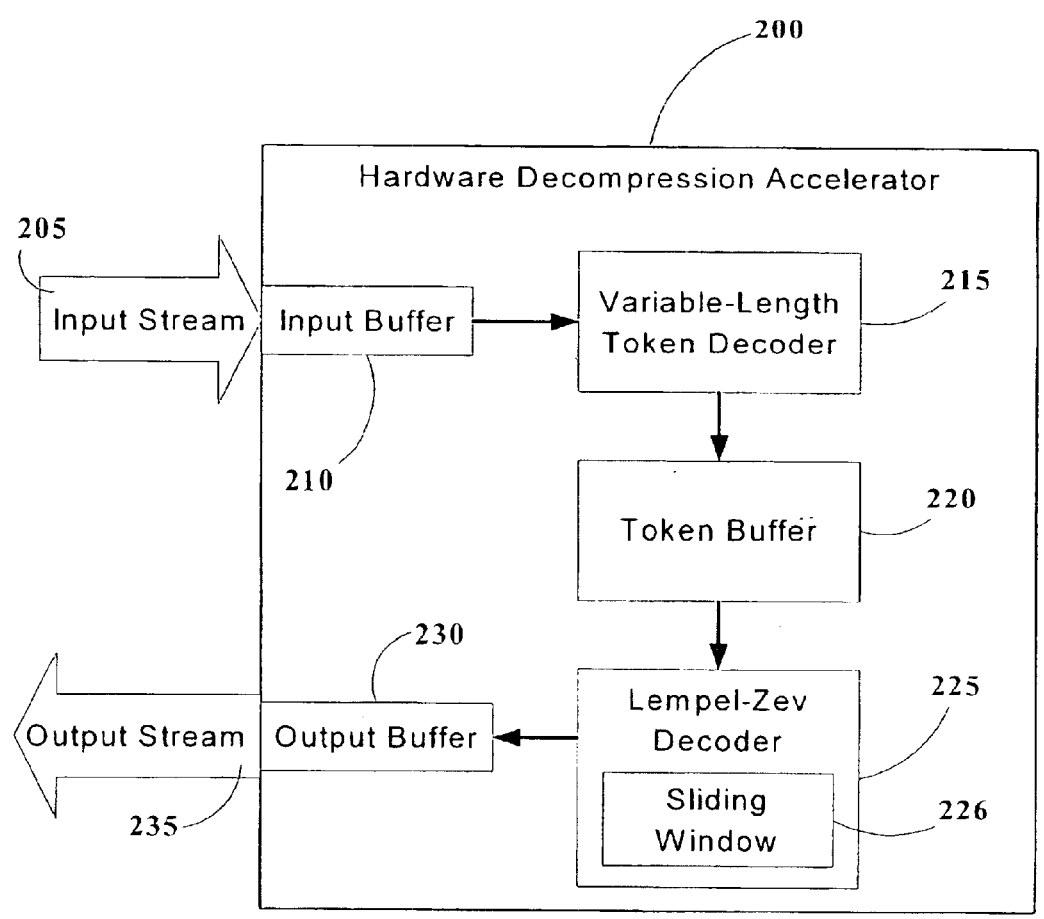
FIG. 2 is a functional block diagram of a decompression accelerator according to an embodiment of the present invention.

FIG. 2 is a high-level functional block diagram of an embodiment of the present invention, a hardware decompression accelerator 200 for use in improving and optimizing decompression performance for data compressed by Lempel-Ziv-Huffman. An input stream 205 contains Lempel-Ziv-Huffman compressed data, which enters an optional input buffer 210. A variable-length token decoder 215 retrieves tokens from input stream 205 and sends the tokens to an optional token buffer 220. At this point, these tokens are pure Lempel-Ziv tokens, as described in RFC 1951. Selective Huffman-decoding is done as necessary, by variable-length token decoder 215 as will be detailed below. The Lempel-Ziv tokens from variable-length token decoder 215 then proceed to a Lempel-Ziv decoder 225, which then reconstructs and outputs the uncompressed data to an optional output buffer 230, and then to an output stream 235. Note that Lempel-Ziv decoder 225 incorporates a sliding window 226, as detailed in RFC 1951. In Lempel-Ziv, recurring data patterns are expressed in token form as references to previous occurrences, and Lempel-Ziv decoder 225 retrieves those previous occurrences from sliding window 226. Lempel-Ziv decoder 225 can be implemented in accordance with RFC 1951 in various ways, some examples of which are disclosed in: U.S. Pat. No. 5,463,390 to Whiting et al.; U.S. Pat. No. 5,572,209 to Farmer et al.; U.S. Pat. No. 5,627,534 to Craft; and U.S. Pat. No. 5,805,086 to Brown et al.

Before considering the implementation of variable-length token decoder 215 for Lempel-Ziv-Huffman decoding according to the present invention, it is useful to review the nature of the variable-length tokens that are output by Lempel-Ziv compression. As specified in RFC 1951, tokens represent either literal bytes ranging from 0 to 255, or paired numbers indicating <length, backward distance> as vectors pointing to previous occurrences of repeated data. In this latter case, the length ranges from 3 to 258; and the backward distance ranges from 1 to 32,768. The literal byte data and the length data are merged into a single code table ranging from 0 to 285, where tokens having code values 0 to decimal 255 represent literal bytes having that same value, the value 256 indicates end-of-block, and code values 257 to 285 indicate length tokens. A literal token contains only a 9-bit code, which uniquely determines the represented literal byte. A length token contains a 9-bit code followed by a pre-determined number of extra bits, ranging from zero up to a maximum of 5 extra bits. A length token uniquely determines the length, in bytes, of a repeated data pattern. Each length token is followed immediately by a backward distance token, which contains a 5-bit code followed by a pre-determined number of extra bits, ranging from zero up to a maximum of 13 extra bits. A backward distance token uniquely determines the backward distance, in bytes, of a previous occurrence of the repeated data pattern. Note that for all tokens (literal tokens, length tokens, and backward distance tokens), the code portion is always Huffman encoded, but the extra bits are already optimally assigned and are not Huffman encoded.

It is important to note that variable-length token decoder 215 is a novel feature of the present invention, which does not appear in the prior art. For example, Mayers does not teach an element comparable to variable-length token decoder 215, which performs selective Huffman decoding.

Length token codes and extra bit counts are as follows (in decimal):

TABLE 1

Lempel-Ziv Length Token Format

| Code | Extra Bits | Length |
| --- | --- | --- |
| 0–256 | 0 | 0 (n/a) |
| 257 | 0 | 3 |
| 258 | 0 | 4 |
| 259 | 0 | 5 |
| 260 | 0 | 6 |
| 261 | 0 | 7 |
| 262 | 0 | 8 |
| 263 | 0 | 9 |
| 264 | 0 | 10 |
| 265 | 1 | 11, 12 |
| 266 | 1 | 13, 14 |
| 267 | 1 | 15, 16 |
| 268 | 1 | 17, 18 |
| 269 | 2 | 19–22 |
| 270 | 2 | 23–26 |
| 271 | 2 | 27–30 |
| 272 | 2 | 31–34 |
| 273 | 3 | 35–42 |
| 274 | 3 | 43–50 |
| 275 | 3 | 51–58 |
| 276 | 3 | 59–66 |
| 277 | 4 | 67–82 |
| 278 | 4 | 83–98 |
| 279 | 4 | 99–114 |
| 280 | 4 | 115–130 |
| 281 | 5 | 131–162 |
| 282 | 5 | 163–194 |
| 283 | 5 | 195–226 |
| 284 | 5 | 227–257 |
| 285 | 0 | 258 |

It is noted that the codes listed in Table 1, above, and Table 2, below, are well-known in the art, as are the methods for using these codes, and are covered in detail in RFC 1951.

For example, a literal/length token with the decimal code value 186 represents a literal byte having that value (hexadecimal BA). A literal/length token with the decimal code value 266 is a length token, and includes 1 extra bit to determine if the length is 13 or 14. A literal/length token with the decimal value 273 represents a length code, and has 3 extra bits to determine which of the 8 values from 35 to 42 is the length. The binary value of the extra bits is added to the base (minimum) value corresponding to the code in Table 1 to determine the length. For convenience in illustrating the operation of the present invention, the function Table 1 (code) is defined to be the number of extra bits corresponding to code in Table 1 above. For example: Table 1 (186)=0; Table 1 (279)=4. For completeness, Table 1 includes the code values 0 through decimal 256 as the first entry with a length 0, even though these code values are not applicable for length tokens. Then, the literalLength (code)

may be defined as follows, to easily distinguish between literal tokens and length tokens:

$$literalLength\ (code) = \begin{cases} literal \leftarrow code < 256 \\ length \leftarrow code > 256 \end{cases}$$

For example, literalLength (186)=literal, meaning that a code of 186 corresponds to a literal token; literalLength (279)=length, meaning that a code of 279 corresponds to a length token. It is noted that the code value of 256 corresponds to the end-of-block in RFC 1951, and therefore does not correspond either to a literal token or a length token.

Note that representing a code from 0 to the decimal value 285 requires 9 bits. This is normally somewhat inefficient because 9 bits can encode from 0 to 511, and the code values from 286 to 511 are not used. By further compressing these codes with Huffman, however, this inefficiency can be mitigated. Thus, the secondary selective Huffman encoding stage can significantly improve on the compression ratio Lempel-Ziv alone.

The token immediately following a length token (identified as described above) is a backward distance token, with codes and extra bit counts as follows:

TABLE 2

Lempel-Ziv Backward Distance Token Format

| Code | Extra Bits | Dist |
|---|---|---|
| 0 | 0 | 1 |
| 1 | 0 | 2 |
| 2 | 0 | 3 |
| 3 | 0 | 4 |
| 4 | 1 | 5, 6 |
| 5 | 1 | 7, 8 |
| 6 | 2 | 9–12 |
| 7 | 2 | 13–16 |
| 8 | 3 | 17–24 |
| 9 | 3 | 25–32 |
| 10 | 4 | 33–48 |
| 11 | 4 | 49–64 |
| 12 | 5 | 65–96 |
| 13 | 5 | 97–128 |
| 14 | 6 | 129–192 |
| 15 | 6 | 193–256 |
| 16 | 7 | 257–384 |
| 17 | 7 | 385–512 |
| 18 | 8 | 513–768 |
| 19 | 8 | 769–1024 |
| 20 | 9 | 1025–1536 |
| 21 | 9 | 1537–2048 |
| 22 | 10 | 2049–3072 |
| 23 | 10 | 3073–4096 |
| 24 | 11 | 4097–6144 |
| 25 | 11 | 6145–8192 |
| 26 | 12 | 8193–12288 |
| 27 | 12 | 12289–16384 |
| 28 | 13 | 16385–24576 |
| 29 | 13 | 24577–32768 |

For example, a backward distance token with a value 18 represents a backward distance code from 513 to 768, and has 8 extra bits to determine which of these 256 different values is the backward distance. For convenience in illustrating the operation of the present invention, the function Table 2 (code) is defined to be the number of extra bits corresponding to code in Table 2 above. For example: Table 2 (3)=0; Table 2 (27)=12.

Note that encoding from 0 to the decimal value 29 requires 5 bits. As is done with literal/length tokens (above), by compressing these codes with Huffman, the overall compression ratio can be further improved.

Figure 3:
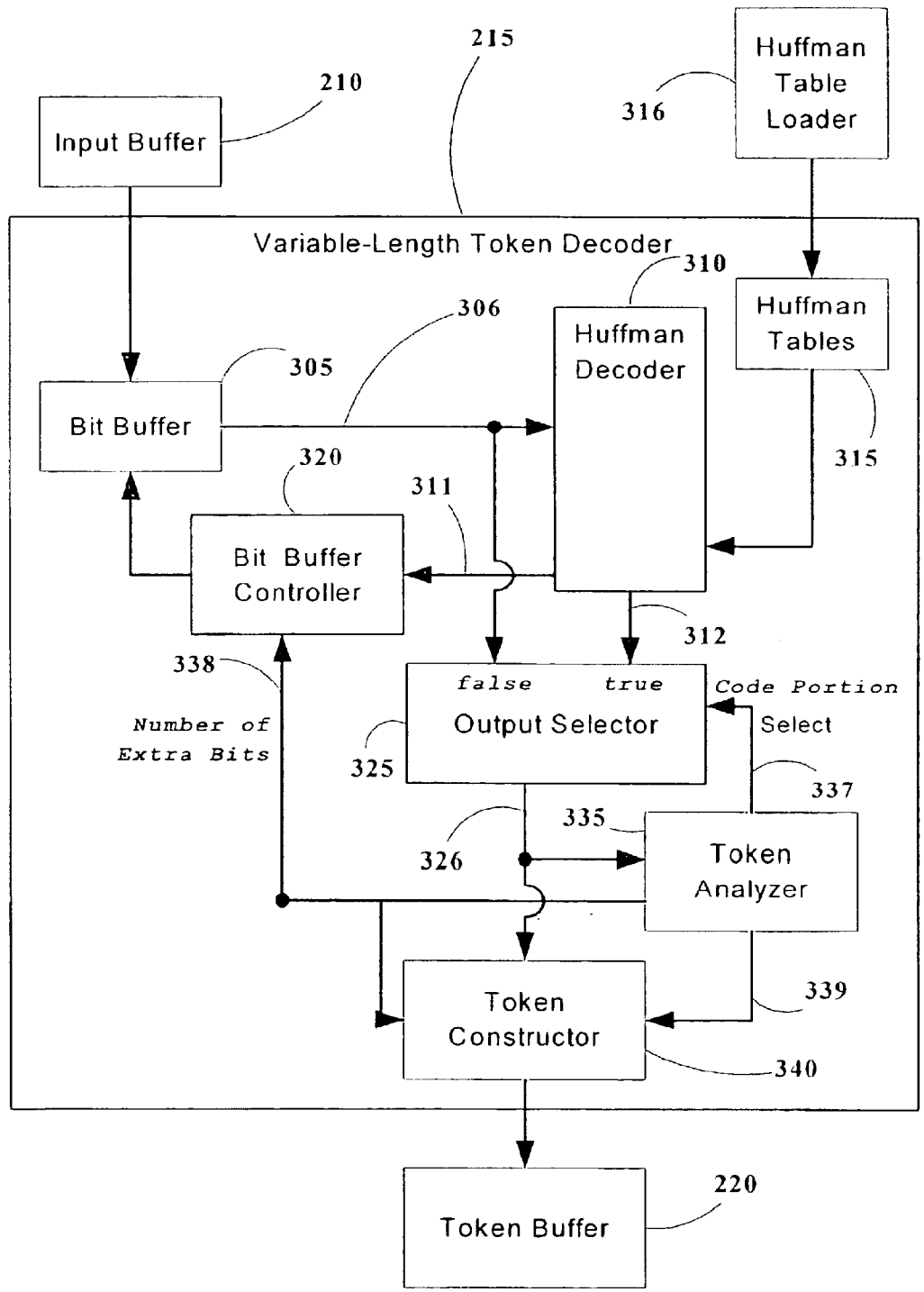
FIG. 3 is a functional block diagram of a variable-length token decoder for use in a decompression accelerator according to an embodiment of the present invention.

FIG. 3 is a high-level functional block diagram of an embodiment according to the present invention of variable-length token decoder 215, which selectively utilizes Huffman decoding. Input buffer 210 (or, if this option is omitted, input stream 205 as in FIG. 2) supplies a stream of bits to a bit buffer 305 which is a linear-shift register capable of shifting out a specified number of bits, and automatically replenishing compressed data from input buffer 210 or input stream 205 on a word-by-word basis. The function of bit buffer 305 is to break fixed-length words from input bit stream 205 into variable-length words for Huffman decoding and for retrieving extra bits, and thus enable bit trains corresponding to tokens of variable length to be taken therefrom. In essence, the stream of bits flowing through bit buffer 305 is a sequence of the variable-length tokens corresponding to Lempel-Ziv-Huffman compressed data. Bit buffer 305 receives this compressed data in data word increments, and has a variable-length output on a line 306, makes compressed data available on a token-by-token basis for decompression in arbitrary numbers of bits, depending on token sizes, from 1 to 15 bits at a time, regardless of byte boundaries.

Bit buffer 305 receives commands indicating how many bits have been decoded or are extra bits, so that the token code and extra bits (if any) can be removed after decoding and processing. To do this, a bit buffer controller 320 sends appropriate commands to bit buffer 305, indicating how many bits to release. Processed tokens are no longer needed, so after a token is processed, the bits therein are discarded by releasing them and shifting them out of bit buffer 305. As noted above, bit buffer 305 automatically and continually replenishes the discarded bits as necessary, as long as there is more data to decompress. Bit buffer controller 320 receives input from a Huffman decoder 310, via a line 311, and also from a token analyzer 335 via a line 338. These inputs direct bit buffer controller 320 to release a specified number of bits after being processed.

Huffman decoding requires a decoding table. Accordingly, Huffman decoder 310 obtains decoding information from Huffman tables 315, which are loaded by a Huffman table loader 316, illustrated in FIG. 3 as external to variable-length token decoder 315. Huffman table loader 316 loads Huffman tables as appropriate, such as by constructing dynamic Huffman tables from header information in the compressed data, and could be implemented by a CPU or similar element. Huffman decoder 310 can be implemented in a number of different ways, examples of which are disclosed in: U.S. Pat. No. 5,208,593 to Tong et al.; U.S. Pat. No. 5,617,089 to Kinouchi et al.; U.S. Pat. No. 5,818, 364 to Hintzman et al.; and U.S. Pat. No. 6,580,377 B1 to Du et al. For Dynamic Huffman encoding, Huffman table information is contained in the block headers of Lempel-Ziv-Huffman compressed data, and is extracted and set up by CPU according to well-known procedures. In preferred embodiments of the present invention, Huffman decoder 310 is capable of Dynamic Huffman decoding, in order to allow the decompression of data compressed by Lempel-Ziv-Huffman compression utilizing Dynamic Huffman encoding, to attain better compression ratios.

Because variable-length token decoder 215 selectively utilizes Huffman decoding, the output is able to selectively bypass Huffman decoder 310. A select line 337 from token analyzer 335 goes to an output selector 325, which selects the output from Huffman decoder 310 via a line 312, or the variable-length output directly from bit buffer 305 via line 306. The details of output selection are described below.

Recalling that the code portion of tokens are always Huffman encoded, it is seen that the decoded token codes are always available at the output of Huffman decoder 310 on line 312. Moreover, whenever output selector 325 is selecting output from Huffman decoder 310 (as described below), the output of Huffman decoder 310 will also be on line 326 and thus available to token analyzer 335.

The function of token analyzer 335 is to determine characteristics of Lempel-Ziv tokens, to coordinate the selective Huffman decoding of the code portions of the Lempel-Ziv tokens, and to coordinate the selective passing of the extra bit portion, if any, of the Lempel-Ziv token without Huffman decoding. Token analyzer 335 receives the decoded Lempel-Ziv token codes output from Huffman decoder 310 in order to determine how many extra bits (if any) are required to complete the reconstruction of the token. It is important to note that it may not be sufficient to merely have the token code. If the output of Huffman decoder 310 does not differentiate between 9-bit and 5-bit Lempel-Ziv codes, certain code values will be ambiguous. For example, reference to Table 1 and Table 2 show that a code value of decimal 24 can either represent a literal byte value with no extra bits (for literal/length tokens, Table 1) or a backward distance ranging from 4097 through 6144 requiring 11 extra bits (for backward distance tokens, Table 2). To avoid possible ambiguity and to distinguish between codes associated with literal/length tokens and those associated with backward distance tokens, therefore, token analyzer 335 keeps track of the current decoding state. This is covered in detail below.

As noted previously, the extra bits are not Huffman encoded, and therefore must be obtained directly from the output of bit buffer 305. After determining the number of extra bits required, token analyzer 335 signals output selector 325 via select line 337 to select output directly from bit buffer 305 output line 306 rather than from Huffman decoder 310 output line 312. Then, token analyzer 335 signals bit buffer controller 320 via line 338 to present the proper number of bits for output. Token analyzer 335 also signals, via a line 339, an optional token constructor 340 to reassemble the token information from the token code (which was previously decoded by Huffman decoder 310) and the extra bits, if any (which were just obtained from bit buffer 305). Token constructor 340 may not be required, depending on the input requirements of Lempel-Ziv decoder 225 (FIG. 2). Lempel-Ziv decoder 225 may accept token codes and extra bits as sequential input, for example, in which case token constructor 340 would not be needed.

Figure 4:
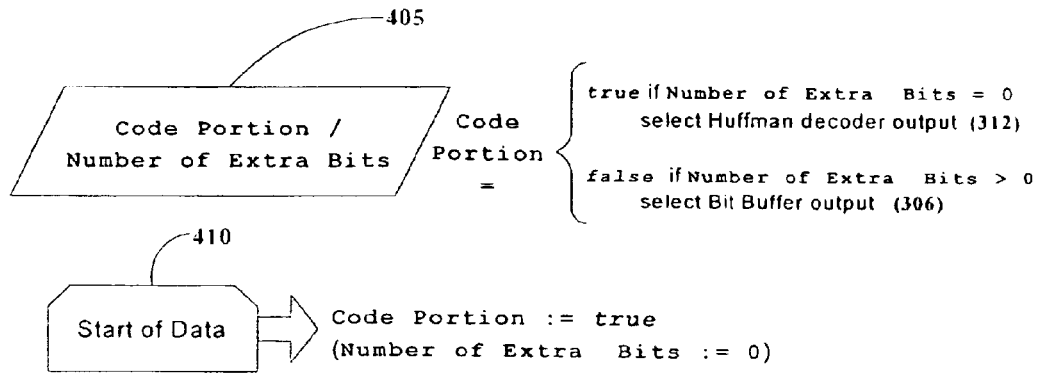
FIG. 4 is a state transition diagram for the variable governing selective Huffman decoding in the variable-length token decoder according to an embodiment of the present invention.
Figure 4:
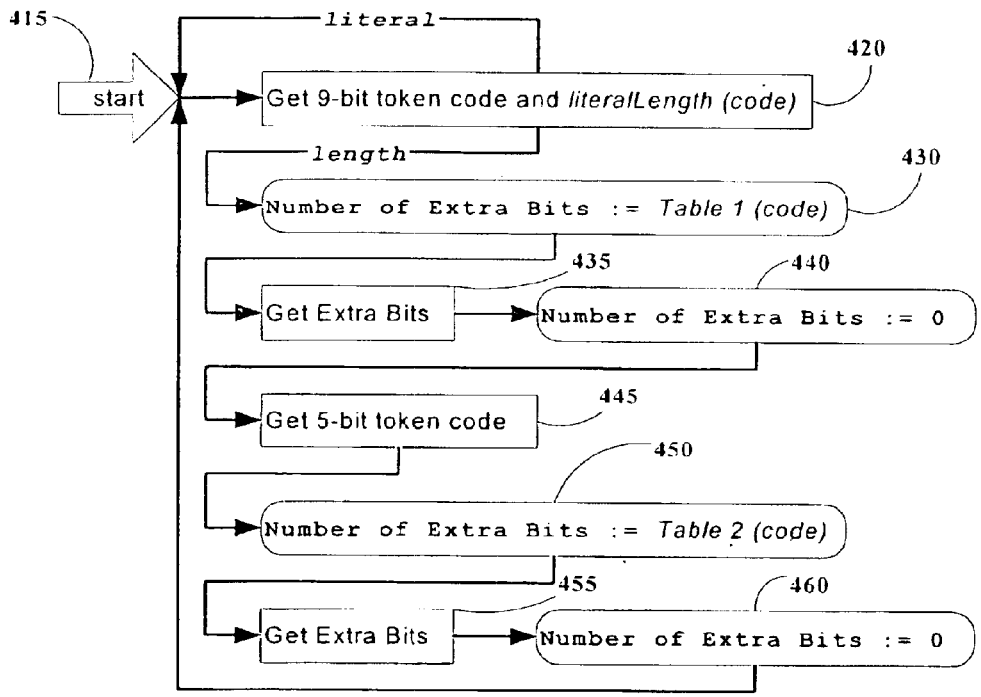

FIG. 4 is a state transition diagram illustrating the operation of token analyzer 335. A pair of data elements Code Portion/Number of Extra Bits 405 is defined as shown. Code Portion is defined as either true or false, and Number of Extra Bits is defined as being an integer in the range from 0 to 13. Code Portion is true when the code portion of a Lempel-Ziv token is being Huffman decoded, and false otherwise. Number of Extra Bits indicates how many extra bits are necessary for the current token. These two elements are related; Code Portion is true if and only if Number of Extra Bits is zero (because if there are no extra bits, the current token is complete simply by having decoded the code portion, and the next token's code portion is ready to be decoded); setting Code Portion:=true is therefore equivalent to setting Number of Extra Bits:=0. Token analyzer 335 presents Code Portion (or the logical equivalent thereof) on select line 337 to output selector 325. When Code Portion is true, output line 312 of Huffman decoder 310 is selected by output selector 325, whereas when Code Portion is false, output selector 325 selects output line 306 from bit buffer 305. In this fashion, the code portions of Lempel-Ziv Huffman tokens are Huffman-decoded by Huffman decoder 310, whereas the extra bit portions are not Huffman-decoded. It is understood that Code Portion and Number of Extra Bits are logical elements which may be implemented in different ways, a non-limiting example of which utilizes a single variable represented by a 4-bit register containing Number of Extra Bits and having a suitable gate arrangement to output a single line with the logical state of Code Portion.

The state transitions of Code Portion/Number of Extra Bits are further illustrated in FIG. 4. At a point 410, where the data starts, Code Portion is initialized to true (or, equivalently, Number of Extra Bits is initialized to zero). This is in preparation for decoding the code portion of the first token. Because Code Portion is true, Huffman decoder 310 output is selected by output selector 325 and the decoded value of the code portion of the first Lempel-Ziv token is thus available to token analyzer 335 via line 326. The state transitions begin at a starting point 415, after which where token analyzer 335 uses the decoded 9-bit token code at a point 420 to obtain the value of the function literalLength (code), which indicates whether the token is a literal byte token or a length token. (The first token in the data stream will always be a literal token) When reading the code portion of a token, Number of Extra Bits will already be zero, so there is no need to perform a reset after receiving a literal token, which has no extra bits. Therefore, when literalLength (code)=literal, the system transition will always simply be to return to starting point 415. If, on the other hand, literalLength (code)=length, a state transition 430 occurs, whereby Number of Extra Bits is set to the value Table 1 (code), as described previously. If Number of Extra Bits is non-zero, this causes Code Portion to become false, and in turn this causes output selector 325 to present the output of bit buffer 305 on line 326. At the same time, token analyzer 335 places Number of Extra Bits on line 338, so that bit buffer 305 will place the token's extra bits on line 306, which will then bypass Huffman decoder 310 to appear directly on line 326. If token constructor 340 is present, the presence of Number of Extra Bits on line 338 will signal that these extra bits are to be used to construct the token. After getting the extra bits (if any) at a point 435, a state transition 440 resets Number of Extra Bits to zero, causing Code Portion to become true in preparation for a point 445, which gets the 5-bit code of the backward distance token which immediately follows the length token. At a state transition 450, Number of Extra Bits is set to the value Table 2 (code), as described previously. In a like manner as before, these extra bits (if any) are retrieved at a point 455, after which a state transition 460 resets Number of Extra Bits to zero, causing Code Portion to become true again. The system returns to starting point 415.

It is understood that the actual construction of circuits to implement embodiments of the present invention can vary. For example, it has already been noted that certain components, such as input buffer 210, token buffer 220, and token constructor 340 may not be required where their functions are performed by other components. In addition, it is understood that the boundaries between the various components can be placed differently. For example, bit buffer 305 may be designed with bit buffer controller 320 as an integral component thereof. Other combinations are also possible. It is therefore understood that the components illustrated in the drawings are intended to convey the operation of functional elements, rather than to portray a specific implementation. Furthermore, in the interests of clarity, supporting low-level components and circuitry (bus support, gates, latches, resisters, and so forth) have been omitted from the drawings. To those skilled in the art, however, the inclusion of such components for implementing operational circuitry to perform the functions detailed above is a straightforward matter.

Furthermore, it is noted that the headers of the Lempel-Ziv-Huffman data blocks must be handled properly. It has already been mentioned that the Huffman table information is contained in these headers and must be processed to construct Huffman tables 315 for Huffman decoder 310. In addition, a block header indicates whether the block utilizes Dynamic Huffman encoding or Static Huffman encoding. As previously described, Dynamic Huffman encoding requires constructing Huffman tables 315 from information contained in the header, whereas Static Huffman encoding utilizes predetermined constant Huffman tables 315. Details on handling these tables are well-known in the art. In addition, a Lempel-Ziv-Huffman data block can also contain raw uncompressed data, in which case no decompression would be applicable. Handling this case is also well-known in the art.

Method for Use

A hardware accelerator for Lempel-Ziv-Huffman decompression according to the present invention can be employed in a practical manner to attain both a relatively high compression ratio as well as very high decompression performance, thereby facilitating the efficient storage and retrieval of data for immediate use. Because the use of data compression featuring a good compression ratio and high-performance decompression the efficiencies include both efficient utilization of storage space when storing the data as well as efficient use of processing resources when retrieving the data for immediate use. An embodiment of the present invention for using such a decompression accelerator in conjunction with a data processor is described below.

Figure 5:
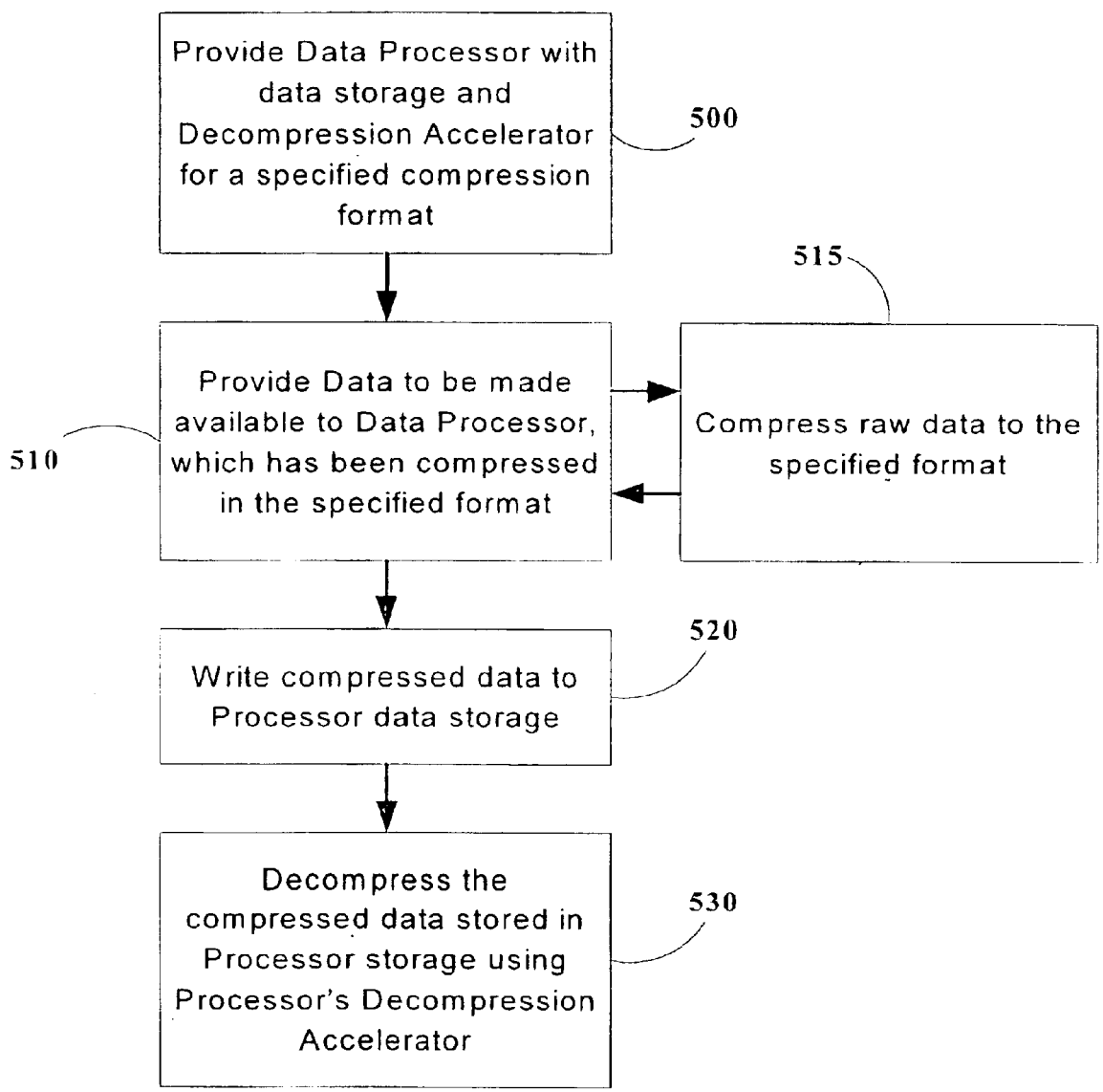
FIG. 5 is a flowchart for a method according to the present invention for achieving a high compression ratio for stored data and also attaining high decompression performance.

FIG. 5 is a flowchart of an embodiment of the present invention which provides a method for using a decompression accelerator as previously described. In a step 500, a data processor having data storage and a decompression accelerator for a specified compression format is provided. As a non-limiting example, in an embodiment of the present invention, the compression format is Lempel-Ziv-Huffman. In a step 510, data which has been compressed according to the specified format is provided. This can be done easily for the Lempel-Ziv-Huffman format, for example, by using commonly-available software such as WinZip, PKZip, or Zlib routines to compress raw data, as in a step 515. The precise means of compressing the data, however, is not important, provided that the data is compressed in compliance with the specified format. In a step 520, the compressed data is written to the processor's data storage. Finally, in a step 530, the compressed data stored in the processor's data storage is decompressed using the processor's decompression accelerator.

While the invention has been described with respect to a limited number of embodiments, it will be appreciated that many variations, modifications and other applications of the invention may be made.

What is claimed is:

1. A decompression accelerator for decompressing Lempel-Ziv-Huffman compressed data from an input stream and sending decompressed data corresponding thereto to an output stream, the decompression accelerator comprising:

(a) a variable-length token decoder for selectively decoding Huffman-encoded code portions of Lempel-Ziv tokens and for selectively retrieving and passing extra bit portions of said Lempel-Ziv tokens without Huffman decoding; and (b) a Lempel-Ziv decoder for decompressing Lempel-Ziv tokens obtained from said variable-length token decoder.

2. The decompression accelerator as recited in claim 1, wherein said variable-length token decoder includes:

i) a bit buffer, for breaking fixed-length words from the input bit stream into variable-length words for Huffman decoding and for retrieving extra bits, said bit buffer having a variable-length output;

ii) a token analyzer, for determining characteristics of a Lempel-Ziv token, for coordinating said selective Huffman decoding of said code portion of each said Lempel-Ziv token, and, if said each Lempel-Ziv token includes said extra bit portion, for coordinating said selective passing of said extra bit portion without Huffman decoding; and iii) a Huffman decoder for effecting said selective Huffman decoding.

3. A decompression accelerator as recited in claim 2, wherein said Huffman decoder is operative to perform dynamic Huffman decoding.

4. A decompression accelerator as recited in claim 2, further comprising at least one component selected from the group consisting of:

(c) an input buffer, for buffering input data words between the input stream and said bit buffer;

(d) a bit buffer controller, for controlling operation of said bit buffer;

(e) an output selector, for selecting output of said Huffman decoder and for selectively passing said variable-length output of said bit buffer; and (f) a token constructor, for, for each said Lempel-Ziv token that includes said extra bit portion, assembling said code portion of said each Lempel-Ziv token as decoded by said Huffman decoder and said extra bit portion so as to reproduce said each Lempel-Ziv token.

5. A decompression accelerator as recited in claim 1, further comprising at least one component selected from the group consisting of:

(c) a token buffer for buffering said Lempel-Ziv tokens from said variable-length token decoder and from said Lempel-Ziv decoder; and (d) an output buffer, for buffering decompressed output from said Lempel-Ziv decoder to the output stream.

6. A data processor comprising a decompression accelerator as recited in claim 1.

7. A data processor as recited in claim 6, further comprising flash memory.

8. A memory controller comprising a decompression accelerator as recited in claim 1.

9. The memory controller recited in claim 8, wherein the memory controller is a flash memory controller.

10. A memory device comprising the memory controller recited in claim 8.

11. A memory device comprising a decompression accelerator as recited in claim 1.

12. The memory device as recited in claim 11, wherein the memory device is a flash memory device.

* * * * *